United States Patent
Park et al.

(10) Patent No.: US 7,620,102 B2
(45) Date of Patent: Nov. 17, 2009

(54) DIGITAL BROADCASTING TRANSMISSION AND RECEPTION SYSTEM

(75) Inventors: Eui-jun Park, Seoul (KR); Hae-joo Jeong, Seoul (KR); Joon-soo Kim, Seoul (KR); Jung-pil Yu, Suwon-si (KR); Yong-sik Kwon, Seoul (KR); Kum-ran Ji, Seoul (KR); Jong-hun Kim, Suwon-si (KR); Jin-hee Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 539 days.

(21) Appl. No.: 11/416,256

(22) Filed: May 3, 2006

(65) Prior Publication Data

US 2007/0183525 A1   Aug. 9, 2007

Related U.S. Application Data

(60) Provisional application No. 60/765,175, filed on Feb. 6, 2006.

(51) Int. Cl.
*H04B 1/66* (2006.01)

(52) U.S. Cl. .................. 375/240.01; 375/265; 375/341; 375/349; 348/14.13; 348/385.1; 348/425.3; 348/432.1; 348/473

(58) Field of Classification Search ................. 375/219, 375/222, 240.01, 262, 264, 265, 270, 277, 375/285, 295, 296, 301, 316, 321, 340, 341, 375/346, 349; 348/14.13, 385.1, 393.1, 395.1, 348/397.1, 400.1, 403.1, 425.3, 432.1, 460, 348/473, 474; 370/912, 916

See application file for complete search history.

(56) References Cited

U.S. PATENT DOCUMENTS 7,020,828 B2 * 3/2006 Birru .......................... 714/792

(Continued)

FOREIGN PATENT DOCUMENTS

| WO | WO 2005/115001 A1 | 12/2005 |
|---|---|---|
| WO | WO 2005/120062 A1 | 12/2005 |
| WO | WO 2006/006833 A1 | 1/2006 |

OTHER PUBLICATIONS

U.S. Appl. No. 11/702,097, filed Feb. 2007, Eui-jun Park et al., Samsung Electronics Co., Ltd.
International Search Report mailed on May 8, 2007, in International Application No. PCT/KR2007/000613.

(Continued)

*Primary Examiner*—Dac V Ha
(74) *Attorney, Agent, or Firm*—Stein McEwen, LLP

(57) ABSTRACT

A digital broadcasting transmission and reception system includes a digital broadcasting transmission apparatus and a digital broadcasting reception apparatus. The digital broadcasting transmission apparatus that includes a robust processor that codes a robust stream of a dual transport stream where a normal stream and the robust stream are combined. The robust processor includes a demultiplexer (DE-MUX) that separates the normal stream and the robust stream from the dual transport stream; a robust encoder that appends a parity to the separated robust stream; a robust interleaver that interleaves the robust stream having the appended parity; and a MUX that combines the interleaved robust stream and the separated normal stream. The digital broadcasting reception apparatus includes a robust decoder that decodes a robust stream of a dual transport stream where a normal stream and the robust stream are combined. The robust decoder includes a first decoder that trellis-decodes the robust stream; a robust deinterleaver that interleaves the trellis-decoded robust stream; a second decoder that convolution decodes the deinterleaved robust stream; a robust interleaver that interleaves the convolution-decoded robust stream; and a frame formatter that adds decoded data of the second decoder to a part that corresponds to a position of the robust stream of a frame where the normal stream and the robust stream are mixed. Accordingly, a receiver of a simple structure can be provided.

8 Claims, 12 Drawing Sheets

U.S. PATENT DOCUMENTS

| | | | |
|---|---|---|---|
| 7,111,221 B2 * | 9/2006 | Birru et al. | 714/755 |
| 7,194,047 B2 * | 3/2007 | Strolle et al. | 375/341 |
| 2002/0146074 A1 * | 10/2002 | Ariel et al. | |
| 2005/0152411 A1 * | 7/2005 | Breti et al. | |
| 2006/0126733 A1 * | 6/2006 | Boyce et al. | |

OTHER PUBLICATIONS

Written Opinion of the International Searching Authority mailed on May 8, 2007, in International Application No. PCT/KR2007/000613.

U.S. Appl. No. 11/416,250, filed May 3, 2006, Eui-jun Park et al., Samsung Electronics Co., Ltd.

* cited by examiner

FIG. 6A (a)
| SYNC | PID | Robust data |
|---|---|---|
| 1 | 3 | 184 |

(b)
| SYNC | PID | AF Header | Null data |
|---|---|---|---|
| 1 | 3 | 2 | N |
| | | | Normal data 182-N |

(c)
| SYNC | PID | AF Header | Robust data |
|---|---|---|---|
| 1 | 3 | 2 | N |
| | | | Normal data 182-N |

FIG. 6B

| SYNC | PID | | | |
|---|---|---|---|---|
| 1 | 3 | Robust data | Normal data | Normal data |
| SYNC | PID | | | |
| SYNC | PID | | | |
| SYNC | PID | Normal data | | |

· · ·

FIG. 7A (a)
| SYNC | PID | Robust data |
|---|---|---|
| 1 | 3 | 184 |

(b)
| SYNC | PID | AF Header | Stuff byte | Null data | Normal data |
|---|---|---|---|---|---|
| 1 | 3 | 2 | S | N | 182-N-S |

(c)
| SYNC | PID | AF Header | Stuff byte | Robust data | Normal data |
|---|---|---|---|---|---|
| 1 | 3 | 2 | S | N | 182-N-S |

FIG. 7B

| SYNC | PID | AF Header | Stuff byte | Robust data |
|---|---|---|---|---|
| 1 | 3 | 2 | S | 182-S |
| SYNC | PID | AF Header | Stuff byte | Normal data |
| SYNC | PID | AF Header | Stuff byte | Normal data |
| SYNC | PID | AF Header | Stuff byte | Normal data |

...

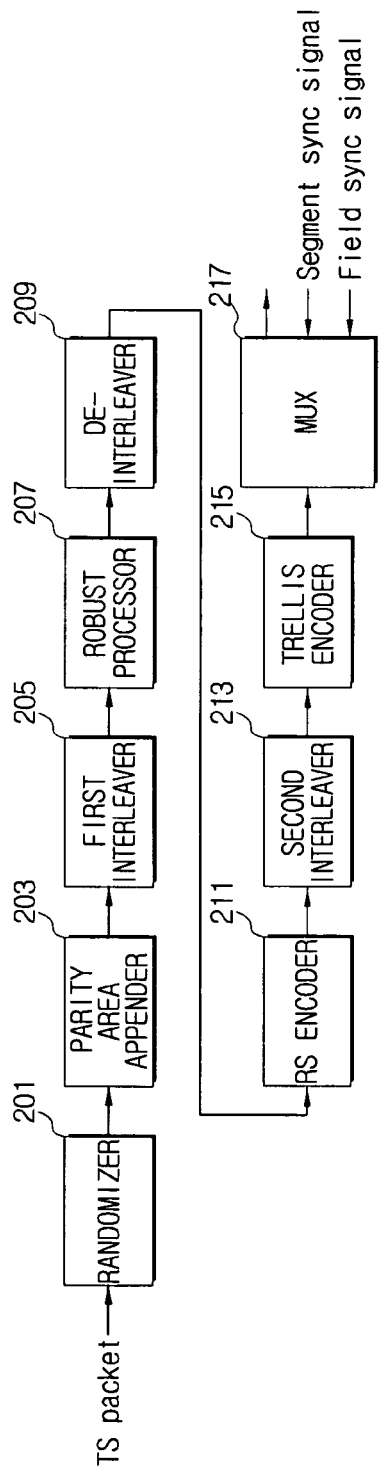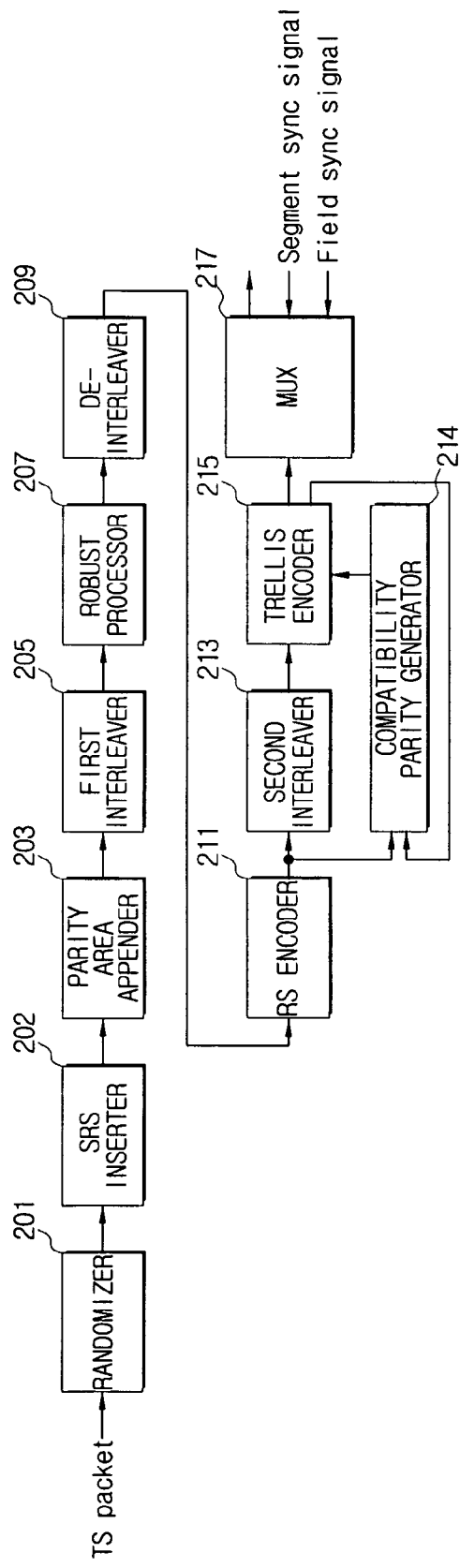

DIGITAL BROADCASTING TRANSMISSION AND RECEPTION SYSTEM

CROSS-REFERENCE TO RELATED APPLICATIONS

This application claims the benefit of U.S. Provisional Application No. 60/765,175 filed Feb. 6, 2006, in the United States Patents and Trademark Office, the disclosure of which is incorporated herein by reference.

BACKGROUND OF THE INVENTION

1. Field of the Invention

Aspects of the present invention generally relate to a digital broadcasting transmission and reception system. More particularly, aspects of the present invention relate to a digital broadcasting transmission and reception system so as to provide a receiving apparatus of a simple structure.

2. Description of the Related Art

The Advanced Television Systems Committee (ATSC) vestigial sideband (VSB) scheme, which is a terrestrial digital broadcasting system in U.S.A., is disadvantageous in that its reception performance is not good in a poor channel environment, particularly, in a Doppler fading channel environment. Thus, the ATSC has accepted new suggestions under preconditions that compatibility with existing receivers is provided, that the existing receivers do not suffer performance depreciation, and that the performance is improved in comparison with the existing receivers in order to enhance the VSB reception performance.

Among the suggestions for VSB system improvement, a dual transport stream scheme enables watching of the existing HD video in a good channel environment and allows for video reception even in a poor channel environment. The dual transport stream scheme generates and transmits a dual transport stream with robust data added to normal data of the conventional ATSC VSB so as to successfully operate in a hostile channel environment.

Hereafter, in reference to FIGS. 1 through 4, a conventional dual transport stream transmission and reception system is described that provides good performance by transmitting and receiving a normal stream and a robust stream and exchanging information by the robust stream.

FIG. 1 is a block diagram of a conventional VSB transmission apparatus, and FIG. 2 is a block diagram of a robust processor of FIG. 1.

Referring first to FIG. 1, the conventional VSB transmission apparatus includes a randomizer 10, a first RS (Reed Solomon) encoder 11, a first interleaver 12, a robust processor 13, a deinterleaver 14, a second RS encoder 15, a second interleaver 16, a trellis encoder 17, and a multiplexer (MUX) 18.

Although it is not shown in the drawing, a dual transport stream (TS), which is the combination of the normal stream and the robust stream, is constructed at the front end of the randomizer 10. The dual transport stream passes through the randomizer 10, the first RS encoder 11, the first interleaver 12, the robust processor 13, the deinterleaver 14, the second RS encoder 15, the second interleaver 16, the trellis encoder 17, and the MUX 18, and then is outputted.

Since the robust processor 13, which is responsible for coding the robust stream, follows the first RS encoder 11, the parity added to the dual transport stream at the front end of the randomizer 10 is not correct. Therefore, the deinterleaver 14 is provided after the robust processor 13, and the second RS encoder 15 is provided to modify the incorrect parity. At this time, the first RS encoder 11 only generates a parity space for interleaving without adding the real parity.

Referring now to FIG. 2, the robust processor 13 includes a symbol interleaver 13a, a normal/robust (N/R) demultiplexer (DE-MUX) 13b, a robust encoder 13c, a robust interleaver 13d, an N/R MUX 13e, and a symbol deinterleaver 13f.

The dual transport stream interleaved by the first interleaver 12 is converted by the symbol at the symbol interleaver 13a, and is separated to a normal stream and a robust stream at the N/R DE-MUX 13b. The normal stream is inputted directly to the N/R MUX 13e. The robust stream is processed at the robust encoder 13c and the robust interleaver 13d, and then fed to the N/R MUX 13e. The N/R MUX 13e multiplexes the normal stream and the robust stream, and the multiplexed stream is converted by the bit at the symbol deinterleaver 13f for outputting.

FIG. 3 is a block diagram of a conventional VSB receiving apparatus, and FIG. 4 is a block diagram of a robust decoder of FIG. 3.

Referring to FIG. 3, the conventional VSB receiving apparatus includes a demodulator 20 for processing the dual transport stream received from the VSB transmission apparatus of FIG. 1, an equalizer 21, a viterbi decoder 22, a robust decoder 23, a MUX 24, a first deinterleaver 25, an RS decoder 26, a first derandomizer 27, a second deinterleaver 28, a parity eraser 29, a second derandomizer 30, and a robust packet DE-MUX 31.

Referring now to FIG. 4, the robust decoder 23 of FIG. 3 includes a TCM MAP decoder 23a (TCM refers to trellis code modulation; MAP refers to maximum a posteriori probability.), a robust deinterleaver 23b, a robust MAP decoder 23c, a robust interleaver 23d, a frame formatter 23e, and a symbol deinterleaver 23f.

As shown in the drawings, information exchange is conducted through a loop formed between the TCM MAP decoder 23a and the robust MAP decoder 23c until sufficient performance is acquired. Upon the completion of the information exchange, the data output from the TCM MAP decoder 23a is used for receiving the normal stream, and the frame formatter 23e forwards the data output from the robust MAP decoder 23c to a position corresponding to the robust stream of the normal stream and the robust stream. In doing so, the empty position corresponding to the normal stream is outputted via the symbol deinterleaver 23f to be used for the robust stream reception.

As discussed above, when the conventional VSB transmission and reception apparatuses add the robust coding, such as a ¼ rate coding, to the robust stream using the robust encoder 13c, the VSB receiving apparatus of FIG. 4 should be constructed in accordance with the structure of the VSB transmission apparatus of FIG. 3. As shown, the VSB receiving apparatus has a complicated structure.

SUMMARY OF THE INVENTION

Aspects of the present invention have been provided to address the above-mentioned and other problems and disadvantages occurring in the conventional arrangement, and an aspect of the present invention is to provide a receiver of a simple structure for the performance improvement of a robust stream included in a dual transport stream even when additive coding is implemented at various rates.

Additional aspects and/or advantages of the invention will be set forth in part in the description which follows and, in part, will be obvious from the description, or may be learned by practice of the invention.

In accordance with the above aspect of the present invention, a digital broadcasting transmission system comprises a digital broadcasting transmission apparatus and a digital broadcasting reception apparatus, wherein the digital broadcasting transmission apparatus includes a robust processor that codes a robust stream of a dual transport stream in which a normal stream and the robust stream are combined, wherein the robust processor comprises a demultiplexer (DE-MUX) that separates the normal stream and the robust stream from the dual transport stream; a robust encoder that appends a parity to the separated robust stream; a robust interleaver that interleaves the robust stream having the appended parity; and a multiplexer (MUX) that combines the interleaved robust stream and the separated normal stream. The digital broadcasting reception apparatus includes a robust decoder that decodes a received robust stream of a received dual transport stream where a received normal stream and the received robust stream are combined. The robust decoder comprises a first decoder that trellis-decodes the received robust stream; a robust deinterleaver that interleaves the trellis-decoded robust stream; a second decoder that convolution decodes the deinterleaved robust stream; a robust interleaver that interleaves the convolution-decoded robust stream; and a frame formatter that adds decoded data of the second decoder to a part that corresponds to a position of the received robust stream of a frame where the received normal stream and the received robust stream are mixed.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 6A and 6B are diagrams showing a format of a dual transport stream;

FIGS. 7A and 7B are diagrams showing another format of the dual transport stream;

FIG. 8 is a block diagram of a digital broadcasting transmission apparatus which receives the dual transport stream of FIG. 6A or FIG. 6B;

FIG. 9 is a block diagram of a digital broadcasting transmission apparatus which receives the dual transport stream of FIG. 7A or FIG. 7B;

DETAILED DESCRIPTION OF THE EMBODIMENTS

Figure 1:
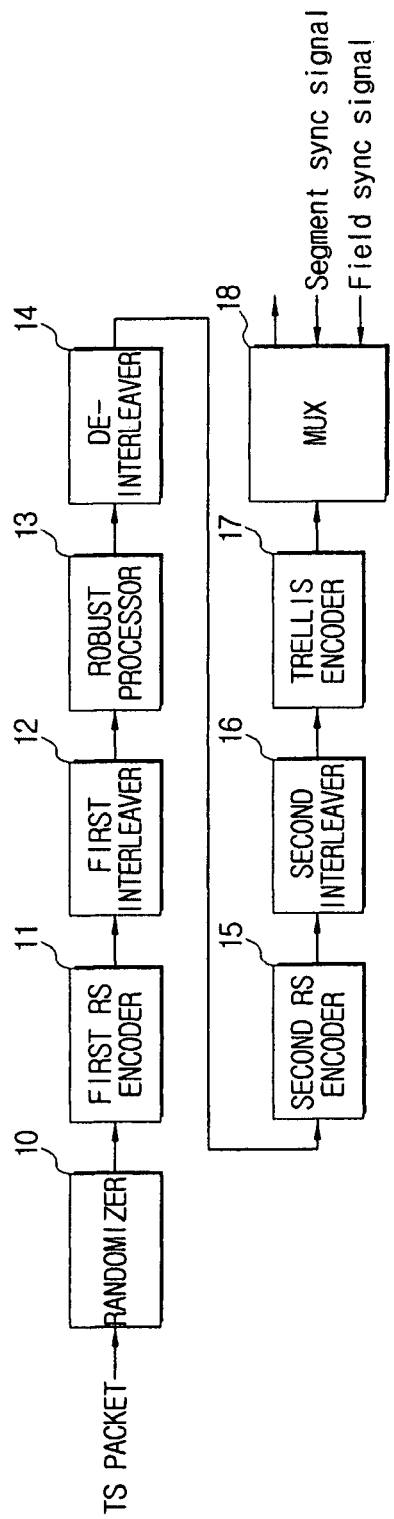
FIG. 1 is a block diagram of a conventional VSB transmission apparatus.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 5:
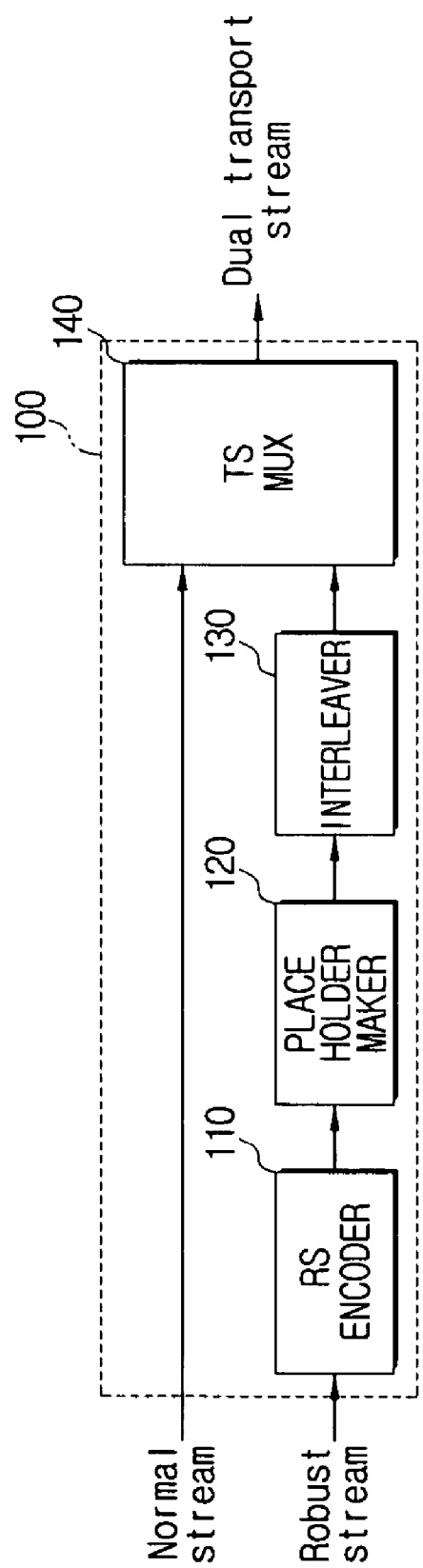
FIG. 5 is a block diagram of a TS constructor which is applied to the present invention.

FIG. 5 is a block diagram of a TS constructor.

A dual transport stream, which is applied to aspects of the present invention, is the combination of a normal stream and a robust stream. The dual transport stream can be generated at the TS constructor 100 of FIG. 5.

Referring now to FIG. 5, the TS constructor 100 includes a Reed-Solomon (RS) encoder 110, a place holder maker 120, an interleaver 130, and a TS MUX 140.

A normal stream and a robust stream are respectively input to the TS constructor 100. At this time, the normal stream is input directly to the TS MUX 140, whereas only the robust stream passes through the TS encoder 110, the place holder maker 120, and the interleaver 130 and then is fed to the TS MUX 140.

Parity is added to the robust stream at the RS encoder 110, and the place holder maker 120 generates an area to which parity is to be inserted by the robust encoder, which will be explained later. The robust stream is interleaved at the interleaver 130. Next, TS MUX 140 constructs a dual transport stream by multiplexing the normal stream and the robust stream. This method of generating a dual transport stream is well known to persons skilled in the art, and thus the detailed description of the TS constructor 100 will be omitted for brevity.

FIGS. 6A and 6B are diagrams showing formats of a dual transport stream.

Typically, a MPEG packet consists of a 1-byte sync, a 3-byte header, and a 184-byte payload. The header of the MPEG packet includes a packet identifier (PID). The type of data contained in the payload part determines whether the MPEG packet is the normal stream or the robust stream.

Stream (a) of FIG. 6A is an example of the robust stream inputted to the TS constructor 100. The payload part contains the robust data. The robust data is processed at the RS encoder 110, the placer holder maker 120, and the interleaver 130 of the TS constructor 100 and then fed to the TS MUX 140.

Stream (b) of FIG. 6A is an example of the normal stream inputted to the TS constructor 100. While the payload part contains the normal data, the stream (b) also includes an adaptation field into which the robust data is inserted by taking account of the combination with the robust stream. The adaptation field includes a 2-byte AF header and an N-byte null data space.

The robust stream (a) of FIG. 6A and the normal stream (b) of FIG. 6A are multiplexed at the TS MUX 140 to thus construct a dual transport stream as shown in stream (c) of FIG. 6A.

FIG. 6B shows another combination of the robust stream and the normal stream. A whole packet contains either the robust data or the normal data. The TS MUX 140 arranges the robust stream and the normal stream in the ratio of 1:3. Although the robust stream and the normal stream are shown as arranged in the ratio of 1:3 by way of example, the arrangement is not limited to this exemplary ratio.

FIGS. 7A and 7B are diagrams showing another format of the dual transport stream.

Stream (a) of FIG. 7A is a robust stream, and stream (b) of FIG. 7A is a normal stream including an S-byte stuff byte in the adaptation field. The S-byte stuff byte is an area to which a supplementary reference sequence (SRS) will be inserted by an SRS inserter, to be explained. The TS MUX 140 constructs a dual transport stream as shown in stream (c) by combining the robust stream (a) and the normal stream (b).

FIG. 7B shows a combination of the robust stream including the stuff byte and the normal stream in which a whole packet contains either the robust data or the normal data. The the robust stream and the normal stream are arranged in the ratio of 1:3 by way of example. It should be noted that the positions of the robust data and the stuff byte may be altered if necessary.

FIG. 8 is a block diagram of a digital broadcasting transmission apparatus that receives the dual transport stream of FIG. 6A or FIG. 6B. In this embodiment of the present invention, the digital broadcasting transmission apparatus includes a randomizer 201, a parity area appender 203, a first interleaver 205, a robust processor 207, a deinterleaver 209, an RS encoder 211, a second interleaver 213, a trellis encoder 215, and a MUX 217.

The randomizer 201 randomizes the dual transport stream input from the TS constructor 100. The dual transport stream fed to the randomizer 201 is formatted as in stream (c) of FIG. 6A or as in FIG. 6B. If an MPEG header is used, the dual transport stream may be 188 bytes. If an MPEG header is not used, the dual transport stream may be 187 bytes.

The parity area appender 203 adds an area so that the parity can be inserted into the randomized dual transport stream for error correction. The parity is inserted to this area at the RS encoder 211, to be explained.

The first interleaver 205 interleaves the dual transport stream having the appended area for inserting the parity. The interleaving serves to change data positions in a frame, rather than to change the data per se.

The robust processor 207 performs encoding in order to improve the performance of the robust stream included in the interleaved dual transport stream. The robust processor 207 will be further explained in reference to FIGS. 10 through 14.

The first deinterleaver 209 deinterleaves the dual transport stream processed at the robust processor 207.

The RS encoder 211 appends parity to the deinterleaved dual transport stream. In doing so, the RS encoder 211 inserts the parity into the area that was added to the dual transport stream by the parity area appender 203.

The second interleaver 213 interleaves the dual transport stream having the appended parity.

The trellis encoder 215 performs the trellis encoding to the interleaved dual transport stream.

The MUX 217 adds a segment sync signal and a field sync signal to the trellis-encoded dual transport stream and multiplexes it. Next, although it is not illustrated, the dual transport stream to which the segment sync signal and the field sync signal have been added passes through channel modulation and conversion to a signal of an RF channel band, and then is transmitted.

FIG. 9 illustrates a digital broadcasting transmission apparatus according to another embodiment of the present invention. In particular, FIG. 9 is a block diagram of a digital broadcasting transmission apparatus that receives the dual transport stream of FIG. 7A or FIG. 7B.

According to FIG. 9, the digital broadcasting transmission apparatus includes a randomizer 201, an SRS inserter 202, a parity area appender 203, a first interleaver 205, a robust processor 207, a deinterleaver 209, an RS encoder 211, a second interleaver 213, a compatibility parity generator 214, a trellis encoder 215, and a MUX 217.

The digital broadcasting transmission apparatus of this embodiment has a structure similar to the digital broadcasting transmission apparatus of FIG. 8. Therefore, identical reference numerals are used with respect to the like elements.

The randomizer 201 receives the dual transport stream which includes the stuff byte in the adaptation field as shown in stream (c) of FIG. 7A or as shown in FIG. 7B.

The SRS inserter 202 inserts an SRS into the stuff byte included in the dual transport stream which has been randomized at the randomizer 201. In doing so, the loss and mixing ratio of the payload due to the SRS can be determined according to the rate of insertion of the AF header and the stuff byte into the dual transport stream.

The compatibility parity generator 214 generates a compatibility parity based on a packet of the dual transport stream to which the parity is appended by the RS encoder 211 and based on the dual transport stream that is trellis-encoded by the trellis encoder 215. The compatibility parity generator 214 provides the generated compatibility parity to the trellis encoder 215.

The trellis encoder 215 trellis-encodes the dual transport stream that has been interleaved by the second interleaver 213 and provides the trellis-encoded dual transport stream to the compatibility parity generator 214. Afterwards, when the compatibility parity is fed from the compatibility parity generator 214, the trellis encoder 215 appends the compatibility parity to the interleaved dual transport stream and provides it to the MUX 217.

The MUX 217 adds a segment sync signal and a field sync signal to the dual transport stream to which the compatibility parity has been appended by the trellis encoder 215, multiplexes and outputs the resultant stream.

Figure 10A:
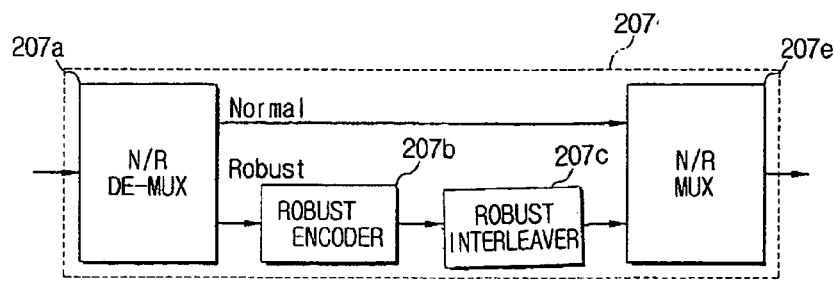
FIG. 10A is a block diagram of a robust processor according to one embodiment of the present invention.

FIG. 10A is a block diagram of a robust processor according to one embodiment of the present invention.

As shown in FIG. 10A, the robust processor 207 according to an embodiment of the present invention includes an N/R DE-MUX 207a, a robust encoder 207b, a robust interleaver 207c, and an N/R MUX 207e.

The N/R DE-MUX 207a demultiplexes the dual transport stream that has been interleaved by the first interleaver 205 and thus separates the normal stream and the robust stream. Next, the N/R DE-MUX 207a converts the bytewise robust stream into two bits starting from a most significant bit (MSB) to a least significant bit (LSB) in order, and provides the converted two bits to the robust interleaver 207c.

For instance, when 1-byte input, that is, an 8-bit input is numbered from the MSB to the LSB in order, such as 7, 6, 5, 4, 3, 2, 1, 0, the 8-bit input is converted to 4 symbols in the order of (7, 6), (5, 4), (3, 2), and (1, 0).

Next, the N/R DE-MUX 207a provides the normal stream, which is separated through the demultiplexing, to the N/R MUX 207e, and provides the robust stream, which is converted to the symbols, to the robust encoder 207b.

The robust encoder 207b convolutionally encodes the robust stream fed from the N/R DE-MUX 207a. Herein, convolution encoding refers to parity appending with respect to the robust stream.

According to this embodiment of the present invention, an encoder of a Recursive Systematic Code (RSC) type can be used as the robust encoder 207b and will be described in further detail in reference to FIG. 11.

The robust interleaver 207*c* interleaves the convolutionally encoded robust stream.

The N/R MUX 207*e* outputs a dual transport stream by multiplexing the normal stream fed from the N/R DE-MUX 207*a* and the robust stream fed from the symbol deinterleaver 207*d*.

Figure 10B:
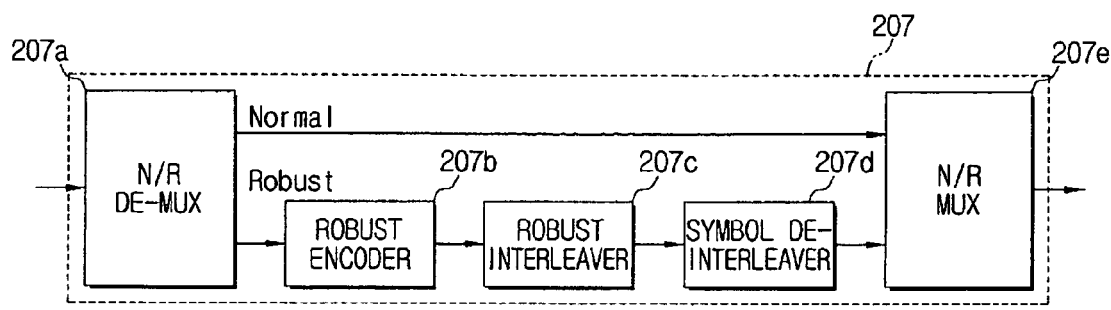
FIG. 10B is a block diagram of a robust processor according to another embodiment of the present invention.

FIG. 10B is a block diagram of a robust processor according to another embodiment of the present invention. Since the robust processor 207 of FIG. 10B has a similar structure to the robust processors 207 of FIG. 10A and shares the same elements, but with differences as further described herein, the same reference numeral 207 is used herein to identify both the robust processors 207 of FIGS. 10A and the robust processor 207 of FIG. 10B. As shown in FIG. 10B, the robust processor 207 includes the same elements as the robust processor 207 of FIG. 10A, in particular, an N/R DE-MUX 207*a*, a robust encoder 207*b*, a robust interleaver 207*c*, and an N/R MUX 207*e*. The robust processor 207 of FIG. 10B further includes a symbol deinterleaver 207*d*. The symbol deinterleaver 207*d* deinterleaves the interleaved robust stream. The symbol deinterleaver will be described in more detail in reference to FIG. 12.

Figure 11:
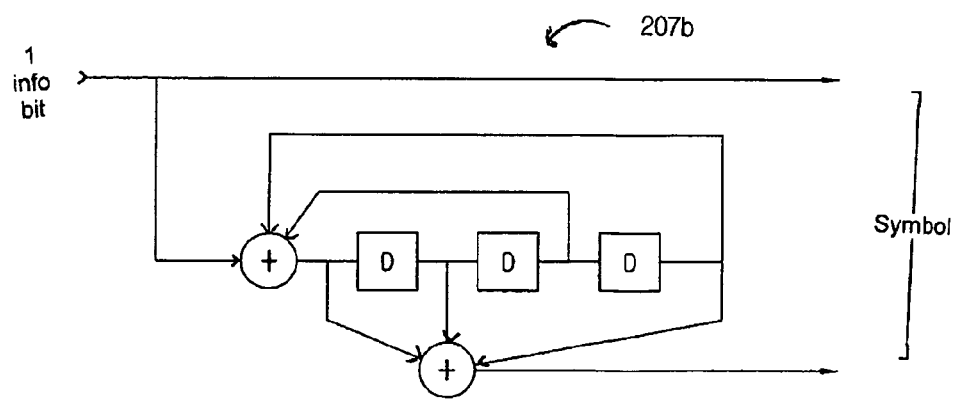
FIG. 11 is a diagram showing a robust encoder of FIG. 10.
Figure 13:
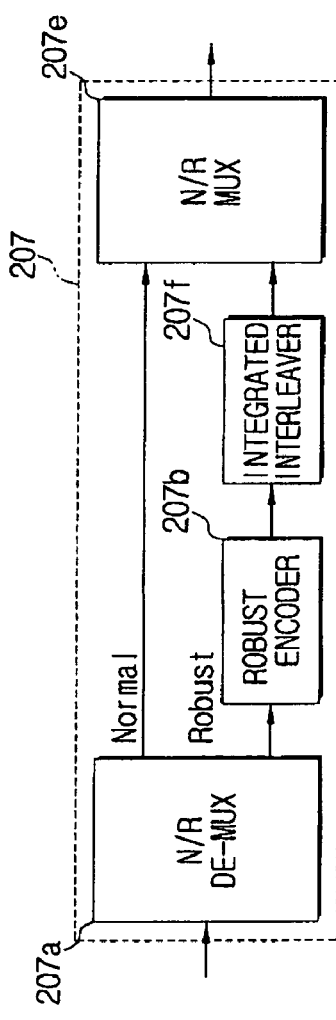
FIG. 13 is a block diagram of a robust processor according to another embodiment of the present invention.

FIG. 11 is a diagram showing the robust encoder 207*b* of FIGS. 10A, 10B and 13.

The robust encoder 207*b* operates in association with the place holder maker 120, which has been illustrated in reference to FIG. 5. For instance, if the place holder maker 120 generates the input data of 7, 6, 5, 4, 3, 2, 1, 0 starting from the MSB to the LSB to the 2-byte data in order of (7, x, 6, x, 5, x, 4, x) and (3, x, 2, x, 1, x, 0, x) for the ½ rate coding, the robust encoder 207*b* receives and codes only the data of 7, 5, 3, 1 of the 2 bits forming one symbol when the input data is converted to 4 symbols in order of (7, 6), (5, 4), (3, 2), (1, 0).

The generated output of 2 bits may be replaced even in a part having no information. When the encoder of the RSC type as shown in FIG. 11 is used for the robust encoder 207*b*, parities are simply replaced in the part having no information since there is no change to the input and the output.

In an embodiment wherein the robust encoder 207*b* performs the coding of ¼ rate, the place holder maker 120 fills only one bit of 4 successive bits with data having information, and inserts an arbitrary value in the remaining three bits. At this time, of 2 symbols consecutively fed to the robust encoder 207*b*, only one bit has information. As mentioned earlier, the robust encoder 207*b* operates with respect to only one bit of the data input, and creates the output of 4 bits to replace a 4-bit part having information or having no information.

For instance, when the place holder maker 120 outputs (a, x, y, z) with respect to an input 1-bit "a" (x, y, z are arbitrary values having no information), two symbols of (a, x), (y, z) being input in sequence are generated by a byte-to-symbol conversion, which is well-known. Only the data part "a" of the input is received in accordance with the operation of the place holder maker 120 so as to output 4 bits. The output 4 bits are replaced with the input 2 symbols of (a, x) and (y, z).

In the embodiment wherein an RSC type encoder as shown in FIG. 11 (the encoder of ½ rate) is used for the robust encoder 207*b*, the output resulting from the ¼ rate may be duplicated.

When two symbols of (a, x), (y, z) are received as the input, only "a" is used as the input and (p1, p2) is outputted. When the output (p1, p2) is generated, (a, p), (a, p) may be outputted.

Of the successive 4-bit output generated for the coding of ¼ rate at the place holder maker 120, the position of the input data may be arbitrary. The robust encoder 207*b* can employ only the agreed data as the input using the data position agreed with the place holder maker 120, and replace all of the 4-bit input by making an output.

As illustrated above, when the place holder maker 120 operates, two successive symbols, which are generated from 1-bit input data using the byte-to-symbol conversion, which groups two bits starting from the MSB to the LSB, are fed to the robust encoder 207.

Figure 2:
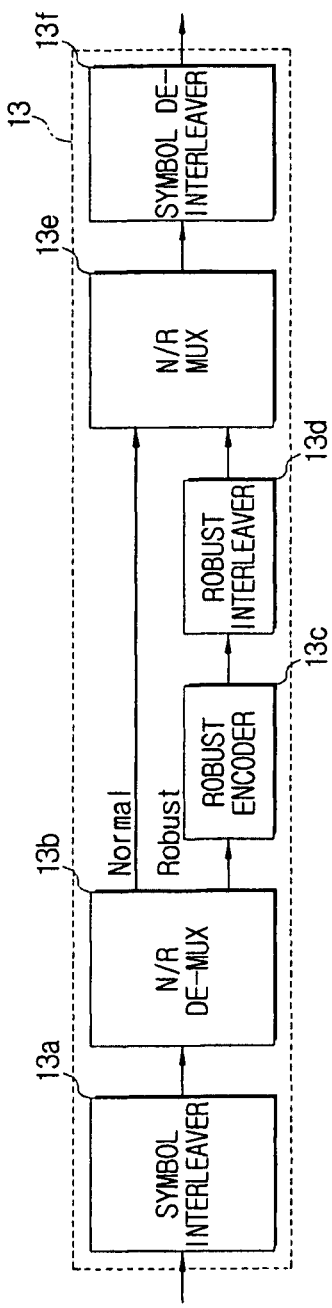
FIG. 2 is a block diagram of a robust processor of FIG. 1.
Figure 3:
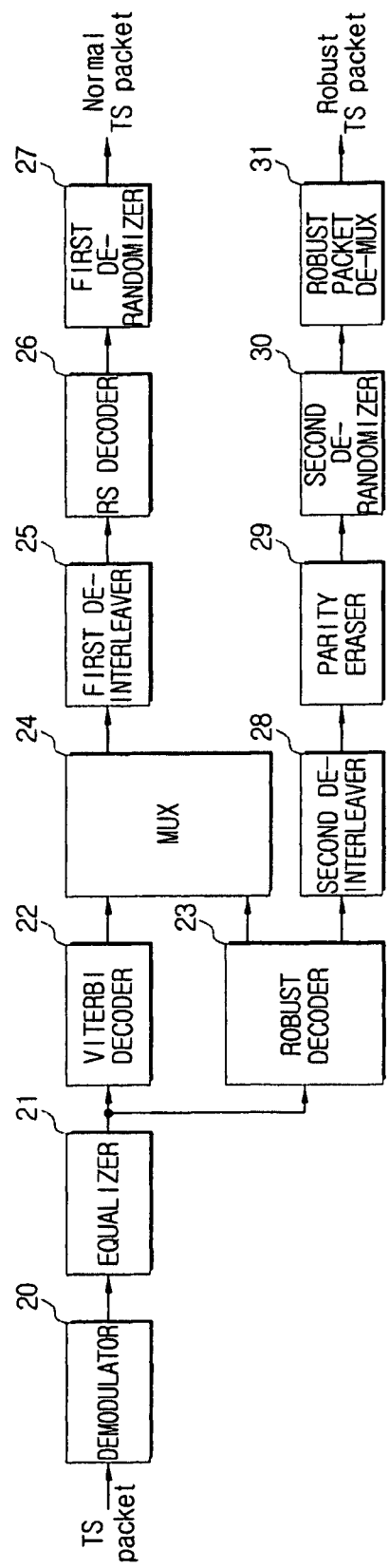
FIG. 3 is a block diagram of a conventional VSB reception apparatus.
Figure 4:
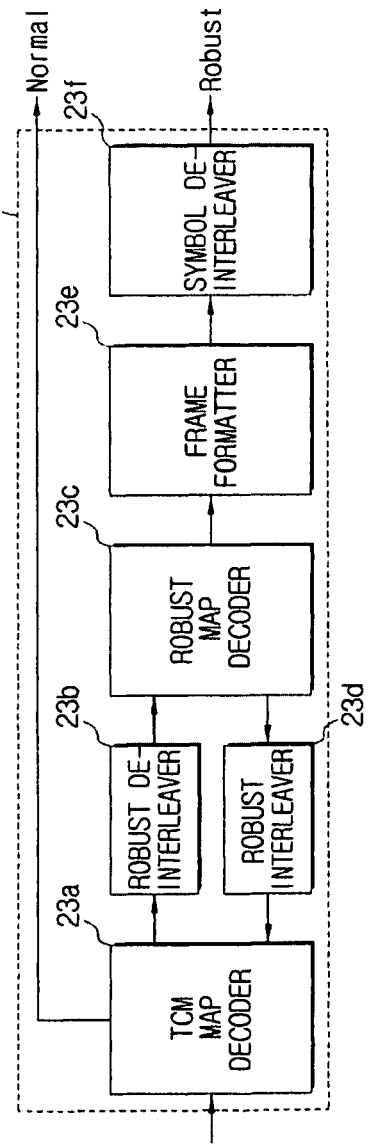
FIG. 4 is a block diagram of a robust decoder of FIG. 3.

In other words, if the conventional robust processor 13 includes the symbol deinterleaver 13*f* in FIG. 2, since the two-symbol positions generated from the 1-bit input are mixed, the conventional digital broadcasting reception apparatus needs to match the two-symbol position at the design phase.

However, in the embodiment of the present invention, as the outputted two symbols generated from the data input appear in succession, the positions of the two symbols can be acquired at any time. Thus, the design of the digital broadcasting receiving apparatus can be simplified.

Figure 12:
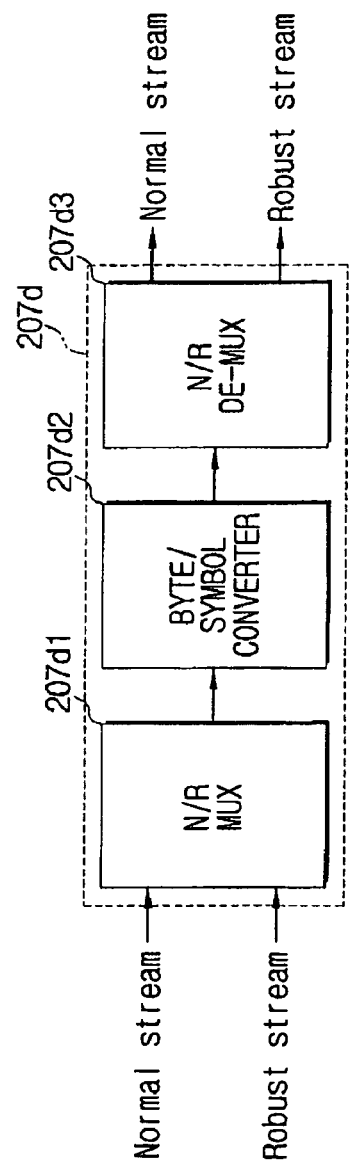
FIG. 12 is a block diagram of a symbol deinterleaver of FIG. 10.

FIG. 12 is a block diagram of the symbol deinterleaver 207*d* of FIG. 10.

The symbol deinterleaver 207*d* serves to deinterleave the interleaved robust stream. The symbol deinterleaver 207*d* includes an N/R MUX 207*d*1, a byte/symbol converter 207*d*2, and an N/R DE-MUX 207*d*3.

The output of the robust encoder 207*b* passes through the robust interleaver 207*c*, which is used to improve the performance in the information exchange at a robust decoder of a digital broadcasting receiving apparatus, to be explained, and the symbol deinterleaver 207*d*. Next, the output is inserted into the original position of the robust stream by combining with the normal stream at the N/R MUX 207*e* and then is outputted.

The symbol deinterleaver 207*d* is used to fulfill the simple information exchange by virtue of the N/R MUX 207*d*1, the byte/symbol converter 207*d*2, and the N/R DE-MUX 207*d*3, without having to passing through the conventional byte-to-symbol conversion at the digital broadcasting receiving apparatus.

The N/R MUX 207*d*1 multiplexes and combines the normal stream and the robust stream fed to the symbol deinterleaver 207*d*.

The byte/symbol converter 207*d*2 converts the normal stream and the robust stream that are multiplexed at the N/R MUX 207*d*1, by the byte.

The N/R DE-MUX 207*d*3 demultiplexes and separates the normal stream and the robust stream that were converted by the byte at the byte/symbol converter 207*d*2, and then outputs the separated streams.

The symbol deinterleaver 13*f* of the conventional robust processor 13 of FIG. 2 operates with respect to all data of the normal stream and the robust stream, whereas the symbol deinterleaver 207*d* according to this embodiment of the present invention operates with respect to only the robust stream. In addition, the symbol deinterleaver 207*d* can be set to have a different value according to the robust stream position of the input data.

As the symbol deinterleaver 207*d* is affected by the deinterleaver 209 and the byte-to-symbol conversion, its size is equal to the symbol size transmitted to the robust stream for 52 segments. For instance, the number of robust stream space appearing in 52 segments is $^{52}\!/_{4}+13$. Herein, by taking account of the conversion of 1 byte to 4 symbols, the symbol deinterleaver 207*d* can serve as a 128*4*13=6656 block interleaver.

FIG. 13 is a block diagram of the robust processor 207 according to another embodiment of the present invention. Since the robust processor 207 of FIG. 13 has a similar structure to the robust processors 207 of FIGS. 10A and 10B and shares the same elements, but with differences as further described herein, the same reference numeral 207 is used herein to identify both the robust processors 207 of FIGS. 10A and 10B and the robust processor 207 of FIG. 13.

While the robust processor 207 as shown in FIG. 10B includes the symbol deinterleaver 207d and the robust interleaver 207c separately, in the robust processor 207 according to the embodiment shown in FIG. 13, the symbol deinterleaver 207d and the robust interleaver 207d are implemented as a single interleaver 207f.

In other words, the symbol deinterleaver 207d and the robust interleaver 207c operate in the same unit size. Thus, as shown in FIG. 13, the symbol deinterleaver 207d and the robust interleaver 207c can be implemented as one interleaver which is an integrated interleaver 207f.

Figure 14:
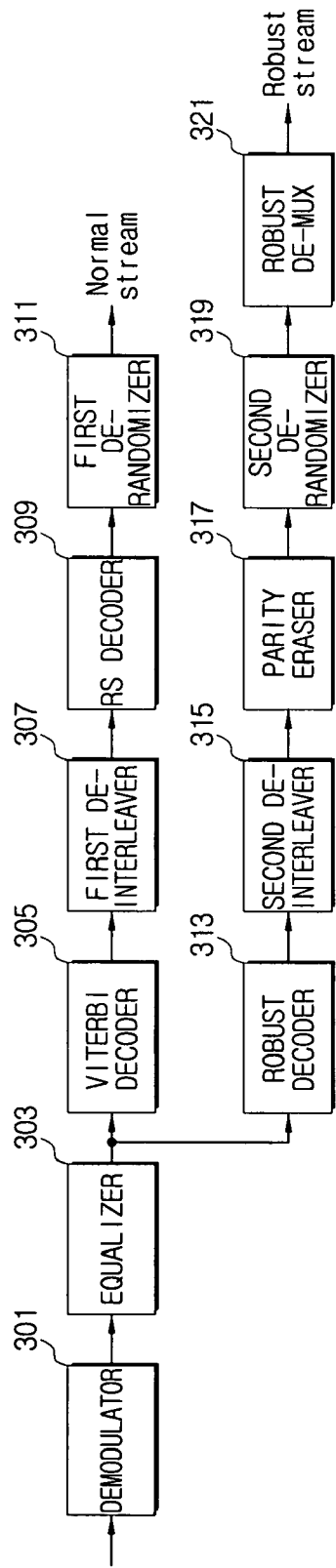
FIG. 14 is a block diagram of a digital broadcasting receiving apparatus which is applied to the present invention.

FIG. 14 is a block diagram of a digital broadcasting receiving apparatus according to an aspect of the present invention.

Referring to FIG. 14, the digital broadcasting receiving apparatus applied to the present invention, includes a demodulator 301, an equalizer 303, a viterbi decoder 305, a first deinterleaver 307, an RS decoder 309, a first derandomizer 311, a robust decoder 313, a second interleaver 315, a parity eraser 317, a second derandomizer 319, and a robust DE-MUX 321.

The demodulator 301 receives the dual transport stream from the digital broadcasting transmission apparatus of FIG. 8 or FIG. 9, detects sync according to the sync signal added to the baseband signal, and performs the demodulation.

The equalizer 303 equalizes the dual transport stream demodulated by the demodulator 301. In more detail, the equalizer 303 can remove the interference of the received symbols by compensating the channel distortion of the dual transport stream due to channel multipath.

The viterbi decoder 305 corrects errors with respect to the normal stream of the dual transport stream and outputs a symbol packet by decoding the error-corrected symbol.

The first deinterleaver 307 deinterleaves the normal stream that has been viterbi-decoded by the viterbi decoder 305.

The RS decoder 309 RS-decodes the normal stream that has been deinterleaved by the first deinterleaver 307.

The first derandomizer 311 derandomizes and outputs the normal stream that has been RS-decoded by the RS decoder 310.

The robust decoder 313 decodes the robust stream of the dual transport stream equalized by the equalizer 303. The robust decoder 313 will be illustrated in detail in reference to FIGS. 15 and 16.

The second interleaver 315 interleaves the robust stream decoded by the robust decoder 313.

The parity eraser 317 eliminates the parity that was appended to the robust stream interleaved by the second interleaver 315.

The second derandomizer 319 derandomizes the robust stream from which the parity was eliminated by the parity eraser 317.

The robust DE-MUX 321 demultiplexes the robust stream that was derandomized by the second derandomizer 319.

Figure 15:
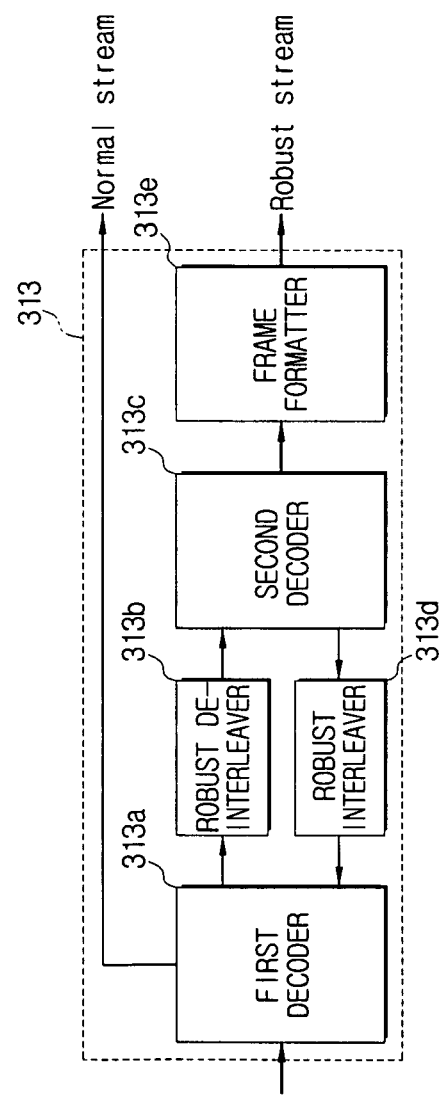
FIG. 15 is a block diagram of a robust decoder according to one embodiment of the present invention.

FIG. 15 is a block diagram of a robust decoder according to one embodiment of the present invention.

Referring to FIG. 15, the robust decoder 313 includes a first decoder 313a, a robust deinterleaver 313b, a second decoder 313c, a robust interleaver 313d, and a frame formatter 313e.

The first decoder 313a trellis-decodes the robust stream.

The robust deinterleaver 313b deinterleaves the robust stream that was trellis-decoded by the first decoder 313a.

The second decoder 313c convolution-decodes the robust stream deinterleaved by the robust deinterleaver 313b.

The robust interleaver 313d interleaves the robust stream convolution-decoded by the second decoder 313c.

The frame formatter 313e adds the decoded data of the second decoder 313c to the part that corresponds to the position of the robust stream in the frame where the normal stream and the robust stream are mixed.

When the information exchange is completed between the first decoder 313a and the second decoder 313c through the robust deinterleaver 313b and the robust interleaver 313d, the decoded data of the first decoder 313a is outputted to be used for the normal stream reception and the decoded data of the second decoder 313c is provided to the frame formatter 313e.

Figure 16:
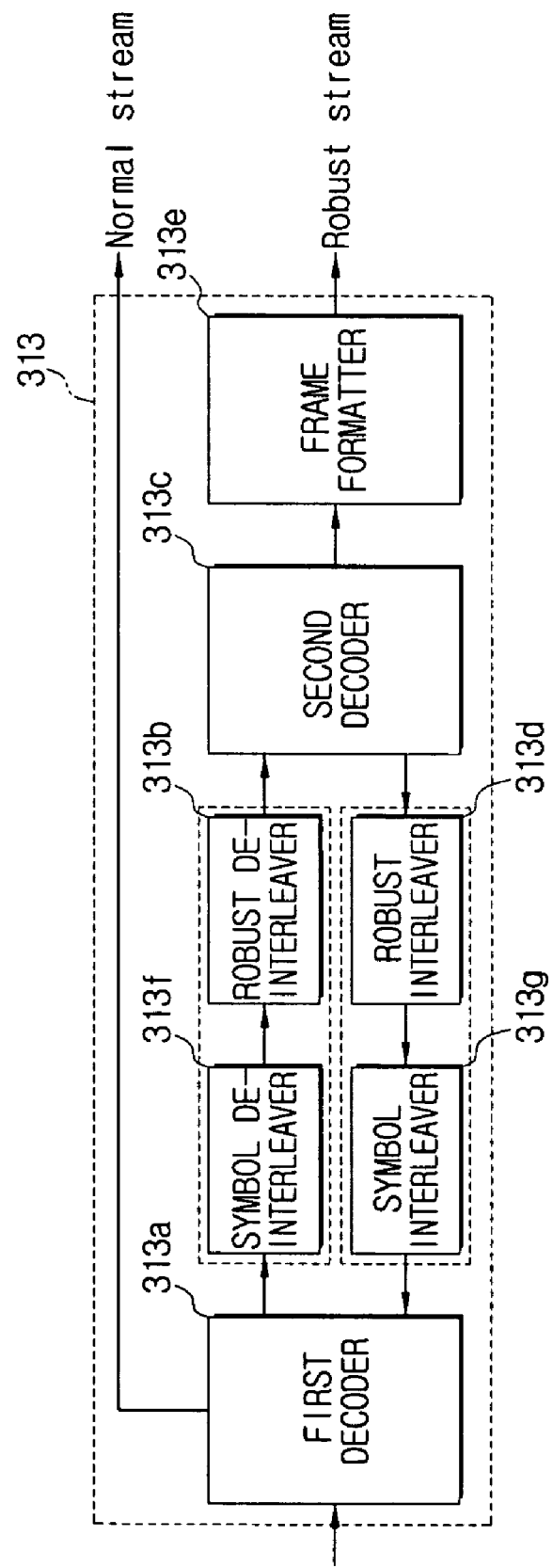
FIG. 16 is a block diagram of a robust decoder according to another embodiment of the present invention.

FIG. 16 is a block diagram of a robust decoder 313 according to another embodiment of the present invention. Because the robust decoder 313 of FIG. 16 has a similar structure to the robust decoder 313 of FIG. 15 and shares the same elements, but with added features as described herein, the same reference numeral 313 is used herein to identify both the robust decoder 313 of FIG. 15 and the robust decoder 313 of FIG. 16.

Referring to FIG. 16, the robust decoder 313 includes a first decoder 313a, a symbol deinterleaver 313f, a robust deinterleaver 313b, a symbol interleaver 313g, a robust interleaver 313d, a second decoder 313c, and a frame formatter 313e.

As such, the robust decoder 313 is applicable to the digital broadcasting reception apparatus when the digital broadcasting transmission apparatus employs the robust processor 207 of FIG. 13.

The decoded data of the first decoder 313a is in a symbol unit. After the decoded data is converted by the byte at the symbol deinterleaver 313f, it is deinterleaved by the robust deinterleaver 313b. The decoded data of the second decoder 313c is in a byte unit. After the decoded data is interleaved by the robust interleaver 313d, it is converted by the symbol by the symbol interleaver 313g.

Figure 17:
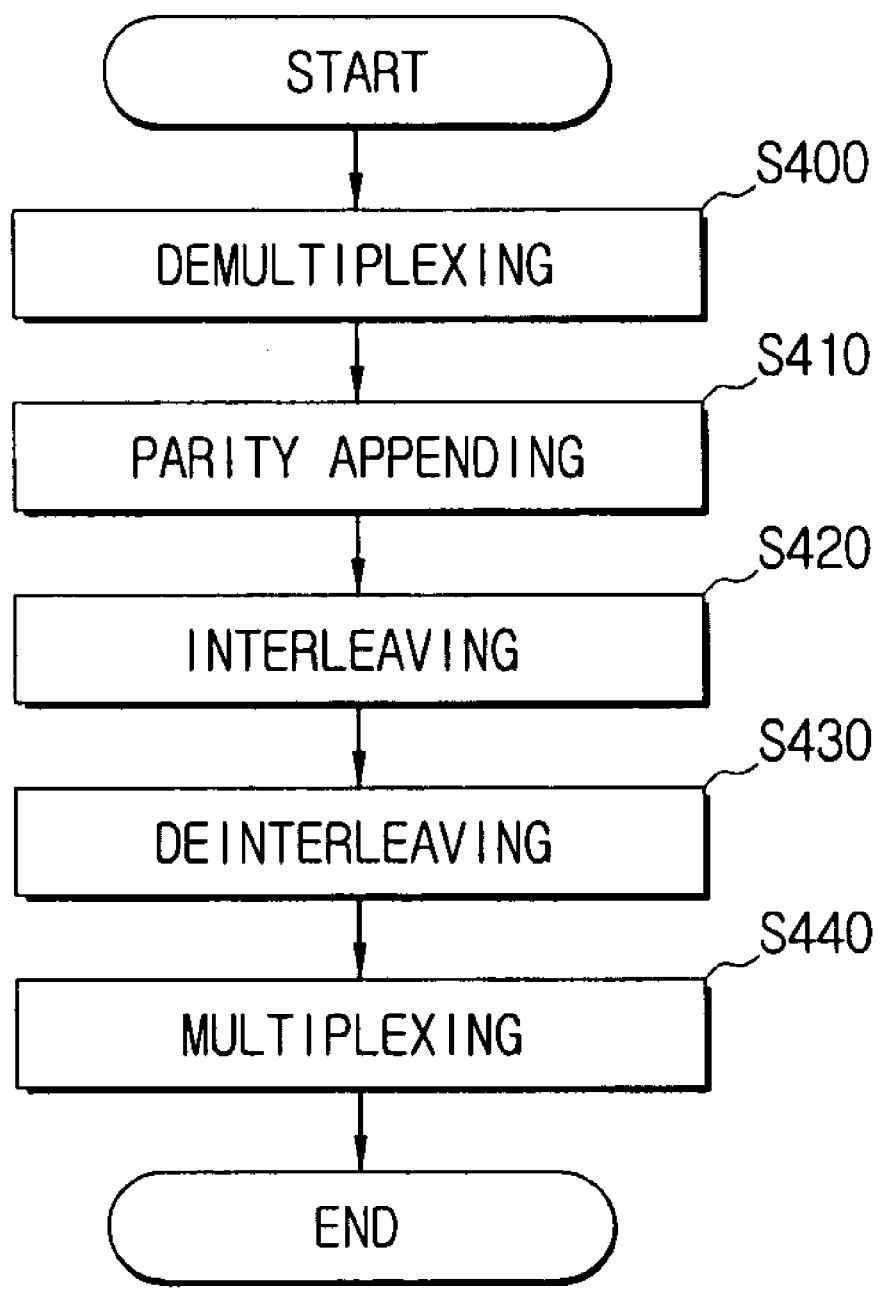
FIG. 17 is a flowchart outlining a robust stream coding method according to an embodiment of the present invention.

FIG. 17 is a flowchart outlining a robust stream coding method according to an embodiment of the present invention.

Hereafter, the robust stream coding method is illustrated in reference to FIGS. 5 through 17. Specifically, the robust stream coding method at the robust processor 207 as shown in FIG. 10 is now illustrated. However, the robust stream coding method at the robust processor 207 as shown in FIG. 13 is similar, except for combining operations S420 and S430.

As explained earlier, prior to the input to the robust processor 207, the dual transport stream goes through randomization, parity area generation, and interleaving. The robust stream included in the dual transport stream is coded at the robust processor 207.

When the dual transport stream is input to the robust processor 207, the N/R DE-MUX 207a separates the normal stream and the robust stream by demultiplexing the dual transport stream. At operation S400, the N/R DE-MUX 207a converts the separated robust stream by the symbol, provides the normal stream directly to the N/R MUX 207e, and provides only the robust stream to the robust encoder 207b.

At operation S410, the robust encoder 207b appends the parity to the robust stream fed from the N/R DE-MUX 207a. At operation S420, the robust interleaver 207c interleaves the parity-appended robust stream.

At operation S430, the symbol deinterleaver 207d deinterleaves the interleaved symbol-wise robust stream. In doing so, the symbol deinterleaver 207d converts and outputs the robust stream by the byte.

After passing through the robust encoder 207b, the robust interleaver 207c, and the symbol deinterleaver 207d, the robust stream separated at the N/R DE-MUX 207a is fed to the N/R MUX 207e. At operation S440, the N/R MUX 207e multiplexes the normal stream fed from the N/R DE-MUX 207a and the robust stream fed from the symbol deinterleaver 207d.

Next, the dual transport stream multiplexed at the N/R MUX 207e is transmitted after passing through deinterleaving, RS encoding, interleaving, trellis encoding, multiplexing, as shown in FIGS. 8 and 9, and undergoing modulation.

Figure 18:
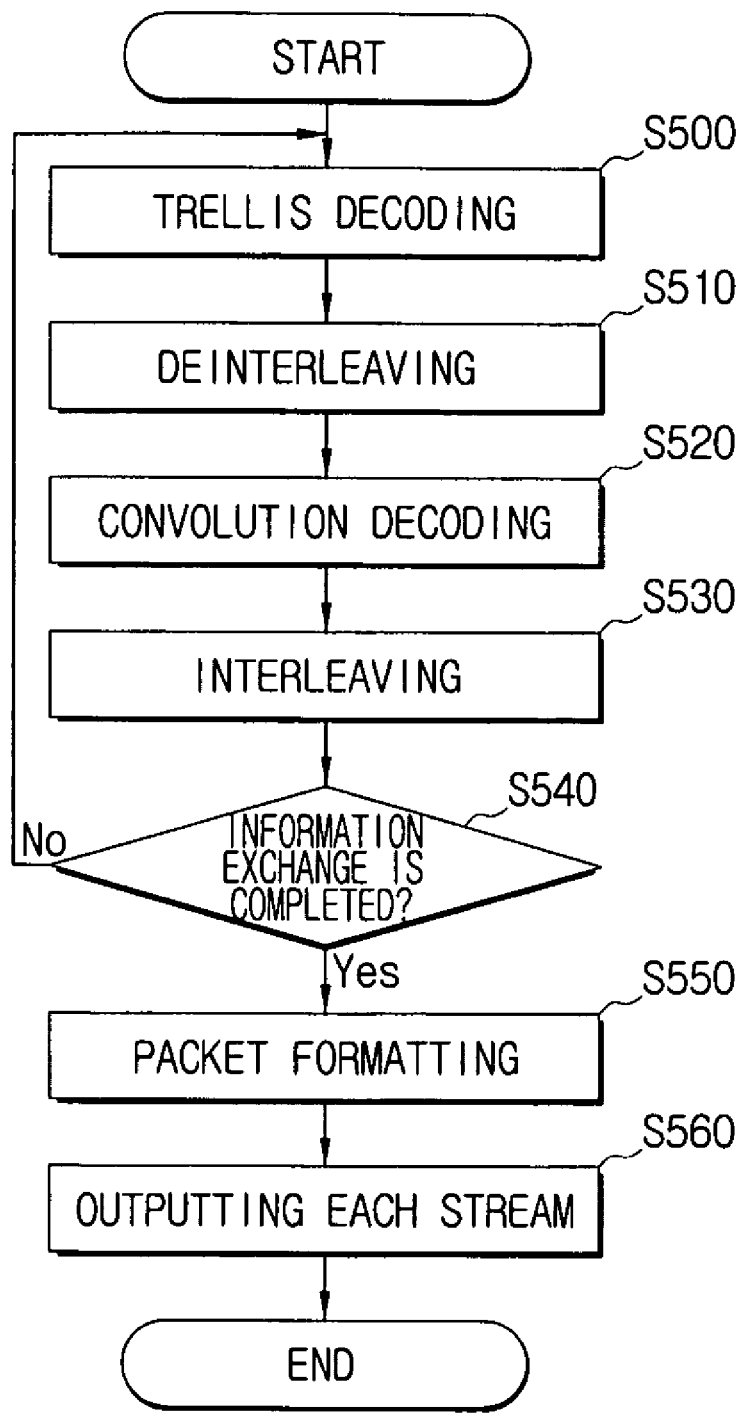
FIG. 18 is a flowchart outlining a robust stream decoding method according to an embodiment of the present invention.

FIG. 18 is a flowchart outlining a robust stream decoding method according to an embodiment of the present invention.

The dual transport stream transmitted from the digital broadcasting transmission apparatus is received at the digital broadcasting receiving apparatus as shown in FIG. 14. The dual transport stream goes through demodulation and equalization. The robust stream included in the dual transport stream is fed to and decoded at the robust decoder 313. Herein, the robust stream decoding method at the robust decoder 313 of FIG. 16 will be described. However, the method at the robust decoder 313 of FIG. 15 is similar.

The robust stream input to the robust decoder 313 is trellis-decoded at the first decoder 313a at operation S500. The trellis-decoded robust stream is deinterleaved at the symbol deinterleaver 313f and robust deinterleaver 313b at operation S510.

The deinterleaved robust stream is convolution-decoded at the second decoder 313c at operation S520. The convolution-decoded robust stream is interleaved at the robust interleaver 313d and symbol interleaver 313g at operation S530.

As the above process is repeated, an information exchange is conducted between the first decoder 313a and the second decoder 313c. Upon the completion of the information exchange at operation S540-Y, the frame formatter 313e adds the decoded data of the second decoder 313c to the part corresponding to the position of the robust stream of the frame (packet formatting) at operation S550. The first decoder 313a and the frame formatter 313e output the normal stream and the robust stream respectively at operation S560.

However, when the information exchange is not yet completed at operation S540, the information exchange continues along the loop formed between the first decoder 313a and the second decoder 313c until the information exchange is completed. In other words, the process returns according to operation 540-N to operation S500 when the information exchange has not been completed.

When the normal stream and the robust stream are produced from the robust decoder 313, the normal stream passes through deinterleaving, RS decoding, and derandomization and the robust stream passes through deinterleaving, parity elimination, derandomization, and demultiplexing as shown, for example, in FIG. 14.

According to an embodiment of the present invention, a digital broadcasting transmission and reception system includes a digital broadcasting transmission apparatus that includes the robust processor 207, according to FIGS. 10A, 10B or 13, for example, comprising a demultiplexer (DE-MUX) 207a that separates the normal stream and the robust stream from the dual transport stream; a robust encoder 207b that appends a parity to the separated robust stream; a robust interleaver 207c that interleaves the robust stream having the appended parity; and a multiplexer (MUX) 207e that combines the interleaved robust stream and the separated normal stream. The robust processor 207 may also include a symbol interleaver 207d (FIG. 10B) or an integrated interleaver 207f (FIG. 13). The digital broadcasting transmission and reception system further includes a digital broadcasting reception apparatus that includes a robust decoder 313, according to FIGS. 15 and 16, for example, that decodes a robust stream of a dual transport stream where a normal stream and the robust stream are combined, wherein the robust decoder comprises a first decoder 313a that trellis-decodes the robust stream; a robust deinterleaver 313b that interleaves the trellis-decoded robust stream; a second decoder 313c that convolution decodes the deinterleaved robust stream; a robust interleaver 313d that interleaves the convolution-decoded robust stream; and a frame formatter 313e that adds decoded data of the second decoder to a part that corresponds to a position of the robust stream of a frame where the normal stream and the robust stream are mixed As set forth, according to an embodiment of the present invention, the digital broadcasting transmission and reception apparatuses and the robust stream coding and decoding methods thereof do not complicate the structure of the receiver even when the additional coding is implemented at various rates to improve the performance of the robust stream included in the dual transport stream. In addition, advantageously, the compatibility with the existing transmission and reception apparatuses are enabled.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A digital broadcasting transmission and reception system comprising a digital broadcasting transmission apparatus and a digital broadcasting reception apparatus, wherein the digital broadcasting transmission apparatus includes a robust processor that codes a robust stream of a dual transport stream in which a normal stream and the robust stream are combined, wherein the robust processor comprises:
a demultiplexer (DE-MUX) that separates the normal stream and the robust stream from the dual transport stream;
a robust encoder that appends a parity to the separated robust stream;
a robust interleaver that interleaves the robust stream having the appended parity; and
a multiplexer (MUX) that combines the interleaved robust stream and the separated normal stream, and wherein the digital broadcasting reception apparatus includes a robust decoder that decodes a received robust stream of a received dual transport stream where a received normal stream and the received robust stream are combined, wherein the robust decoder comprises:
a first decoder that trellis-decodes the received robust stream;
a robust deinterleaver that deinterleaves the trellis-decoded robust stream;
a second decoder that convolution decodes the deinterleaved robust stream;
a robust interleaver that interleaves the convolution-decoded robust stream; and
a frame formatter that adds decoded data of the second decoder to a part that corresponds to a position of the received robust stream of a frame where the received normal stream and the received robust stream are mixed.

2. The digital broadcasting transmission and reception system of claim 1, wherein the DE-MUX of the digital broadcasting transmission apparatus converts and outputs the separated robust stream by the symbol.

3. The digital broadcasting transmission and reception system of claim 2, wherein the robust processor of the digital broadcasting transmission apparatus further comprises a symbol deinterleaver that deinterleaves the robust stream after the robust stream is interleaved by the symbol.

4. The digital broadcasting transmission and reception system of claim 3, wherein the symbol deinterleaver of the digital broadcasting transmission apparatus comprises:
- a (normal/robust) N/R MUX that combines the normal stream and the robust stream;
- a byte/symbol converter that converts the combined normal stream and robust stream by the byte; and
- an N/R DE-MUX that separates the normal stream and the robust stream after the normal stream and the robust stream are converted by the byte.

5. The digital broadcasting transmission and reception system of claim 1, wherein the robust encoder of the digital broadcasting transmission apparatus is a Recursive Systematic Convolutional (RSC) encoder.

6. The digital broadcasting transmission and reception system of claim 1, wherein, the first decoder and the second decoder of the digital broadcasting reception apparatus carry out information exchange through the robust deinterleaver and the robust interleaver and wherein, when the information exchange is completed, the decoded data of the first decoder is output to be used for normal stream reception and the decoded data of the second decoder is provided to the frame formatter.

7. The digital broadcasting transmission and reception system of claim 1, wherein the robust decoder of the digital broadcasting reception apparatus further comprises:
- a symbol deinterleaver that converts the data of the first decoder by the byte; and
- a symbol interleaver that converts the data of the second decoder by the symbol.

8. A digital broadcasting transmission and reception system comprising a digital broadcasting transmission apparatus and a digital broadcasting reception apparatus,
wherein the digital broadcasting transmission apparatus includes a randomizer, a supplementary reference sequence (SRS) inserter, a parity area appender, a first interleaver, a robust processor, a deinterleaver, a Reed Solomon (RS) encoder, a second interleaver, a compatibility parity generator, a trellis encoder, and a multiplexer (MUX),
wherein the robust processor codes a robust stream of a dual transport stream in which a normal stream and the robust stream are combined and comprises:
- a demultiplexer (DE-MUX) that separates the normal stream and the robust stream from the dual transport stream;
- a robust encoder that appends a parity to the separated robust stream;
- a robust interleaver that interleaves the robust stream having the appended parity; and
- a multiplexer (MUX) that combines the interleaved robust stream and the separated normal stream, and wherein the digital broadcasting reception apparatus including a demodulator, an equalizer, a viterbi decoder, a first deinterleaver, an RS MUX decoder, a first derandomizer, a robust decoder, a second interleaver, a parity eraser, a second derandomizer, and a robust DE-MUX,
wherein the robust decoder decodes a received robust stream of a received dual transport stream where a received normal stream and the received robust stream are combined and comprises:
- a first decoder that trellis-decodes the received robust stream;
- a robust deinterleaver that deinterleaves the trellis-decoded robust stream;
- a second decoder that convolution decodes the deinterleaved robust stream;
- a robust interleaver that interleaves the convolution-decoded robust stream; and
- a frame formatter that adds decoded data of the second decoder to a part that corresponds to a position of the received robust stream of a frame where the received normal stream and the received robust stream are mixed.

* * * * *

UNITED STATES PATENT AND TRADEMARK OFFICE
CERTIFICATE OF CORRECTION

PATENT NO. : 7,620,102 B2 Page 1 of 1
APPLICATION NO. : 11/416256
DATED : November 17, 2009
INVENTOR(S) : Park et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 737 days.

Signed and Sealed this

Twenty-sixth Day of October, 2010

David J. Kappos
*Director of the United States Patent and Trademark Office*